(12) United States Patent
Piccardi et al.

(10) Patent No.: US 10,861,565 B2
(45) Date of Patent: Dec. 8, 2020

(54) FUNCTIONAL SIGNAL LINE OVERDRIVE

(71) Applicant: Micron Technology, Inc., Boise, ID (US)

(72) Inventors: Michele Piccardi, Cupertino, CA (US); Luyen Tien Vu, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/290,398

(22) Filed: Mar. 1, 2019

(65) Prior Publication Data

US 2020/0211657 A1 Jul. 2, 2020

Related U.S. Application Data

(60) Provisional application No. 62/787,018, filed on Dec. 31, 2018.

(51) Int. Cl.

| | |
|---|---|
| *G11C 16/04* | (2006.01) |
| *G11C 16/30* | (2006.01) |
| *G11C 16/24* | (2006.01) |
| *G11C 16/08* | (2006.01) |
| *G11C 11/56* | (2006.01) |

(52) U.S. Cl.
CPC .......... *G11C 16/30* (2013.01); *G11C 16/0483* (2013.01); *G11C 16/08* (2013.01); *G11C 16/24* (2013.01); *G11C 11/5621* (2013.01); *G11C 11/5671* (2013.01)

(58) Field of Classification Search
CPC .................. G11C 16/30; G11C 16/24
See application file for complete search history.

(56) References Cited

U.S. PATENT DOCUMENTS

| 5,881,005 A * | 3/1999 | Otori ................. G11C 7/06 365/205 |
| 10,236,053 B1 * | 3/2019 | Ramaraju ............. G11C 7/065 |
| 2008/0008014 A1 * | 1/2008 | Matano ................. G11C 7/02 365/189.11 |

* cited by examiner

*Primary Examiner* — Uyen Smet
(74) *Attorney, Agent, or Firm* — Schwegman Lundberg & Woessner, P.A.

(57) ABSTRACT

Devices and techniques are disclosed herein to compensate for variance in one or more electrical parameters across multiple signal lines of an array of memory cells. A compensation circuit can provide a bias signal to a first one of the multiple signal lines, the bias signal having an overdrive voltage greater than a target voltage by a selected increment for a selected overdrive period according to a functional compensation profile.

25 Claims, 8 Drawing Sheets

FUNCTIONAL SIGNAL LINE OVERDRIVE

PRIORITY APPLICATION

This application claims the benefit of priority to U.S. Application Ser. No. 62/787,018, titled "Functional Signal Line Overdrive", filed 31 Dec. 2018, which is incorporated herein by reference in its entirety.

BACKGROUND

Memory devices are semiconductor circuits that provide electronic storage of data for a host system (e.g., a computer or other electronic device). Memory devices may be volatile or non-volatile. Volatile memory requires power to maintain data, and includes devices such as random-access memory (RAM), static random-access memory (SRAM), dynamic random-access memory (DRAM), or synchronous dynamic random-access memory (SDRAM), among others. Non-volatile memory can retain stored data when not powered, and includes devices such as flash memory, read-only memory (ROM), electrically erasable programmable ROM (EEPROM), erasable programmable ROM (EPROM), resistance variable memory, such as phase change random access memory (PCRAM), resistive random-access memory (RRAM), or magnetoresistive random access memory (MRAM), among others.

Host systems typically include a host processor, a first amount of main memory (e.g., often volatile memory, such as DRAM) to support the host processor, and one or more storage systems (e.g., often non-volatile memory, such as flash memory) that provide additional storage to retain data in addition to or separate from the main memory.

A storage system, such as a solid-state drive (SSD), a Universal Flash Storage (UFS™) device, a MultiMediaCard (MMC) solid-state storage device, an embedded MMC device (eMMC), etc., can include a memory controller and one or more memory devices, including a number of dies or logical units (LUNs). In certain examples, each die can include a number of memory arrays and peripheral circuitry thereon, such as die logic or a die processor. The memory controller can include interface circuitry configured to communicate with a host (e.g., the host processor or interface circuitry) through a communication interface (e.g., a bidirectional parallel or serial communication interface). The memory controller can receive commands or operations from the host system in association with memory operations or instructions, such as read or write operations to transfer data (e.g., user data and associated integrity data, such as error data or address data, etc.) between the memory devices and the host, erase operations to erase data from the memory devices, perform drive management operations (e.g., data migration, garbage collection, block retirement), etc.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
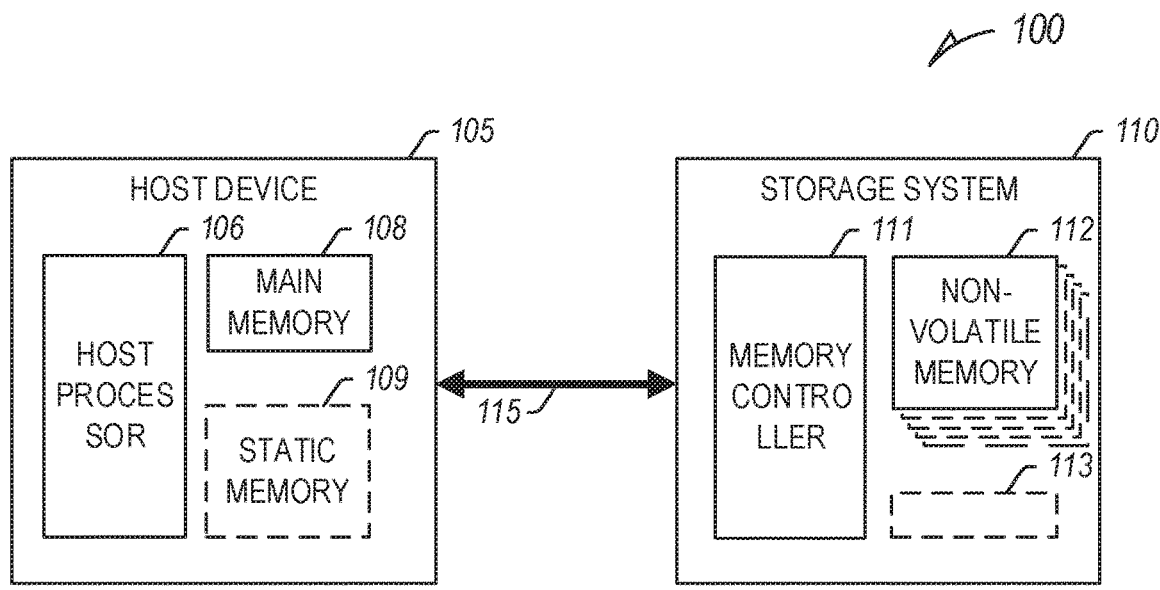
FIG. 1 illustrates an example host system including a host and a storage system.

Signal lines, such as word lines or bit lines, are typically biased to a target condition (e.g., a target voltage), such as using one or more driver circuits, to perform certain memory operations (e.g., read operations, write operations, etc.). A signal line can be biased above a target condition for a duration of time to reduce a settling time of the signal line to the target condition (e.g., a delay in the voltage of the signal line reaching the target condition), such as disclosed in the commonly assigned Tabriz et al. U.S. Pat. No. 9,646,662, titled "Apparatuses, Circuits, and Methods for Biasing Signal Lines," which is hereby incorporated by reference in its entirety, including its disclosure of reducing propagation delay of a bias voltage on a signal line of a mHemory array. In other examples, a signal line can be underbiased to a target condition, such as from a first target condition to a second, lower target condition.

The present inventors have recognized, among other things, systems, apparatus, and methods to further improve memory array and memory system performance using functional signal line overdrive (e.g., or underdrive) to reduce performance variance across a memory array, such as settling time variance across signal lines of the memory array. For example, instead of determining or storing specific overdrive values (e.g., an overdrive coefficient, an overdrive period, etc.) for each signal line of a memory array (or an array of memory cells) or a memory system, a functional representation of the individual values can be determined or stored. Signal lines can include word lines, bit lines, or one or more other signal lines of a memory device. Although described herein with respect to word lines, such devices and techniques can be applied to other signal lines of a memory system, such as bit lines, etc.

Devices and techniques are disclosed herein to compensate for variance in one or more electrical parameters across a number of signal lines (e.g., word lines) of a memory array. In an example, a compensation circuit can provide a bias signal to a first one of the number of signal lines, the bias signal having a magnitude greater than a magnitude of a target condition by an overdrive coefficient for an overdrive period according to a functional compensation profile. In an example, the functional compensation profile can be determined for a memory array, a memory system, specific types of memory arrays and systems, or a group of signal lines. The functional compensation profile can be used, in combination with one or more determined electrical parameters of a memory array, such as a resistance (R) (e.g., $R_{MAX}$, $R_{MIN}$, etc.), a capacitance (C) (e.g., $C_{MAX}$, $C_{MIN}$, etc.), or one or more electrical parameters, to determine the overdrive values for a specific signal line of a specific memory array. In an example, the functional compensation profile can be used to fix a first overdrive parameter, such as a first one of an overdrive coefficient or an overdrive period, and create a distribution for a second overdrive parameter, such as a second one of the overdrive coefficient or the overdrive period, in accordance with the variance of the electrical parameters across a number of signal lines of a memory array. In other examples, the functional compensation profile can include multiple overdrive parameters (e.g., an overdrive coefficient, an overdrive period, etc.). In an example, the fixed parameter can be stored as a part of the compensation or functional compensation profile, or elsewhere outside of the compensation or functional compensation profile. As the values of the variable parameter or parameters depend on the fixed value, the fixed parameter, in certain examples, can still be considered a part of the compensation or functional compensation profile, even when the fixed parameter is not stored directly with the variable parameter or parameters.

Software (e.g., programs), instructions, operating systems (OS), and other data are typically stored on storage systems and accessed by main memory for use by a host processor. Main memory (e.g., RAM) is typically faster, more expensive, and a different type of memory device (e.g., volatile) than a majority of the memory of the storage systems (e.g., non-volatile, such as an SSD, a UFS, an eMMC, etc.). In addition to the main memory, host systems can include different levels of volatile memory, such as a group of static memory (e.g., a cache, often SRAM), often faster than the main memory, in certain examples configured to operate at speeds close to or exceeding the speed of the host processor, but with lower density and higher cost than the main memory. In other examples, more or less levels or quantities of main memory or static memory can be used, depending on desired host system performance, size, complexity, or cost.

FIG. 1 illustrates an example system (e.g., a host system) 100 including a host 105 and a storage system 110 configured to communicate over a communication interface (I/F) 115 (e.g., a bidirectional parallel or serial communication interface). The host 105 can include a host processor 106 (e.g., a host central processing unit (CPU) or other processor or processing device) or other host circuitry (e.g., a memory management unit (MMU), interface circuitry, etc.). In certain examples, the host 105 can include a main memory 108 (e.g., DRAM, etc.) and optionally, a static memory 109, to support operation of the host processor 106.

The storage system 110 can include a solid-state drive (SSD), a universal flash storage (UFS) device, an embedded MMC (eMMC) device, or one or more other memory devices. For example, if the storage system 110 includes a UFS device, the communication interface 115 can include a serial bidirectional interface, such as defined in one or more Joint Electron Device Engineering Council (JEDEC) standards (e.g., JEDEC standard D223D (JESD223D), commonly referred to as JEDEC UFS Host Controller Interface (UFSHCI) 3.0, etc.). In another example, if the storage system 110 includes an eMMC device, the communication interface 115 can include a number of parallel bidirectional data lines (e.g., DAT[7:0]) and one or more command lines, such as defined in one or more JEDEC standards (e.g., JEDEC standard D84-B51 (JESD84-A51), commonly referred to as JEDEC eMMC standard 5.1, etc.). In other examples, the storage system 110 can include one or more other memory devices, or the communication interface 115 can include one or more other interfaces, depending on the host 105 and the storage system 110.

The storage system 110 can include a memory controller 111 and a non-volatile memory 112. In an example, the non-volatile memory 112 can include a number of memory devices (e.g., dies or LUNs), such as one or more flash memory devices, etc., each including periphery circuitry thereon, and controlled by the memory controller 111. Flash memory devices typically include one or more groups of one-transistor, floating gate memory cells. Two common types of flash memory array architectures include NAND and NOR architectures. Memory cells in the memory array are typically arranged in a matrix. The gates of each memory cell in a row of the array are coupled to an access line (e.g., a word line). In NOR architecture, the drains of each memory cell in a column of the array are coupled to a data line (e.g., a bit line). In NAND architecture, the drains of each memory cell in a column of the array are coupled together in series, source to drain, between a source line and a bit line.

In three-dimensional (3D) architecture semiconductor memory device technology, vertical floating gate or charge trapping storage structures can be stacked, increasing the number of tiers, physical pages, and accordingly, the density of memory cells in a memory device. Each memory cell in a NOR, NAND, 3D Cross Point, HRAM, MRAM, or one or more other architecture semiconductor memory array can be programmed individually or collectively to one or a number of programmed states. A single-level cell (SLC) can represent one bit of data per cell in one of two programmed states (e.g., 1 or 0). A multi-level cell (MLC) can represent two or more bits of data per cell in a number of programmed states (e.g., $2^n$, where n is the number of bits of data). In certain examples, MLC can refer to a memory cell that can store two bits of data in one of 4 programmed states. A triple-level cell (TLC) can represent three bits of data per cell in one of 8 programmed states. A quad-level cell (QLC) can represent four bits of data per cell in one of 16 programmed states. In other examples, MLC can refer to any memory cell that can store more than one bit of data per cell, including TLC and QLC, etc.

The non-volatile memory 112 (e.g., a 3D NAND architecture semiconductor memory array) can include a number of memory cells arranged in, for example, a number of devices, planes, blocks, or physical pages. As one example, a TLC memory device can include 18,592 bytes (B) of data per page, 1536 pages per block, 548 blocks per plane, and 4 planes per device. As another example, an MLC memory device can include 18,592 bytes (B) of data per page, 1424 pages per block, 548 blocks per plane, and 4 planes per device, but with half the required write time and twice the program/erase (P/E) cycles as a corresponding TLC memory device. Other examples can include other numbers or arrangements.

The memory controller 111 can receive instructions from the host 105, and can communicate with the non-volatile memory 112, such as to transfer data to (e.g., write or erase) or from (e.g., read) one or more of the memory cells of the non-volatile memory 112. The memory controller 111 can include, among other things, an application specific integrated circuit (ASIC), a field programmable gate array (FPGA), or one or more other processing circuits or firmware, such as a number of components or integrated circuits. For example, the memory controller 111 can include one or more memory control units, circuits, or components configured to control access across the memory array and to provide a translation layer between the host 105 and the storage system 110.

In operation, in the example of NAND-based storage, data is typically written to or read from the storage system 110 in "pages" and erased in "blocks." However, one or more memory operations (e.g., read, write, erase, etc.) can be performed on larger or smaller groups of memory cells, as desired. For example, a partial update of tagged data from an offload unit can be collected during data migration or garbage collection to ensure it was re-written efficiently. The data transfer size of the NAND memory device is typically referred to as a page, whereas the data transfer size of a host is typically referred to as a sector. Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory arrays can provide different size units in which data may be read, written, and erased, and in certain examples may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, an MLC NAND flash device may have a higher bit error rate than a corresponding SLC NAND flash device, and as such, may require more bytes for error data than the corresponding SLC device.

The storage system 110 can include compensation circuitry 113, such as a compensation circuit, a driver circuit, or one or more other circuits configured to bias a signal line of a memory array (e.g., a memory array of the non-volatile memory 112) to provide functional signal line overdrive to reduce performance variation across the memory array, such as settling time variance across signal lines (e.g., word lines, etc.) of the memory array. In certain examples, at least a portion of the functionality of the compensation circuitry 113, such as determining or controlling application of a compensation profile of the functional signal line overdrive, etc., can be implemented in one or more other component of the storage system 110, such as the memory controller 111, one or more circuits or components of the non-volatile memory 112, etc., or in one or more components of the host device 105, such as the host processor 106, etc. The compensation circuitry 113 can control a driver circuit, such as a driver of a row or column decoder, etc., to provide the functional signal line overdrive to the signal line.

Figure 2:
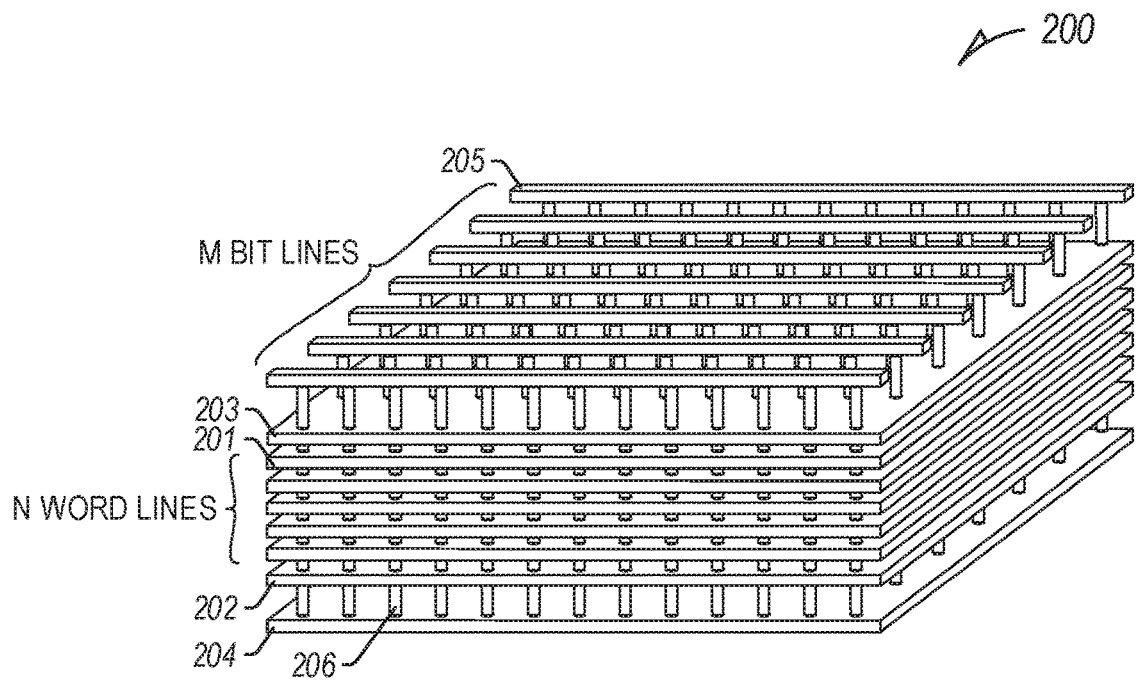
FIG. 2 illustrates an example 3D NAND architecture semiconductor memory array including N word lines and first and second select gates stacked between a source line and M bit lines.

FIG. 2 illustrates an example 3D NAND architecture semiconductor memory array 200 including N word lines 201 and first and second select gates 202, 203, stacked between a source line 204 and M bit lines 205. Multiple pillars extend through the word lines 201 to create memory cells. Due to process (e.g., side and etching effects), the pillar diameter may be irregular (e.g., irregular between the multiple pillars, irregular as each pillar extends through the stacked word lines 201, etc.). Moreover, each word line can vary (e.g., in size, in surface variations, etc.). Accordingly, electrical parameters (e.g., resistance, capacitance, etc.) of each word line can vary with respect to the stack, affecting performance of the memory cells. Although illustrated herein as 5 word lines and 7 bit lines, memory arrays frequently have large numbers of each (e.g., 64, 92, 128, etc.). Electrical parameters of bit lines can also vary; however, such variance is often less than that found in word lines.

Figure 3:
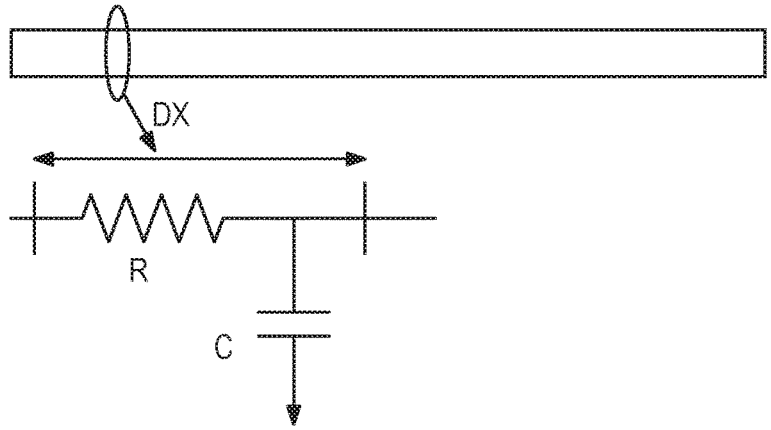
FIG. 3 illustrates an example distributed RC line having a time constant characterized as a product of the resistance and capacitance of the distributed RC line.

FIG. 3 illustrates an example distributed RC line 300 having a time constant characterized as a product of the resistance (R) and capacitance (C) of the distributed RC line 300. The time constant of the distributed RC line 300 is directly proportional to the propagation delay of the distributed RC line 300.

Each word line of a memory array can be illustrated as a distributed RC line having respective electrical parameters that vary across the memory array. As the electrical parameters of the word lines vary, the propagation delay of the word lines across the memory array varies. To account for such variance in a memory array or across a storage system, a maximum propagation delay is typically assumed, limiting the performance of the memory array or storage system.

To improve memory array performance, a signal line (e.g., a word line, a bit line, etc.) can be biased at a voltage higher than the final target ($K_{OD}*V_{TARGET}$) of the signal line for a limited overdrive period ($T_{OD}$) to reduce the settling time of the signal line.

Figure 4:
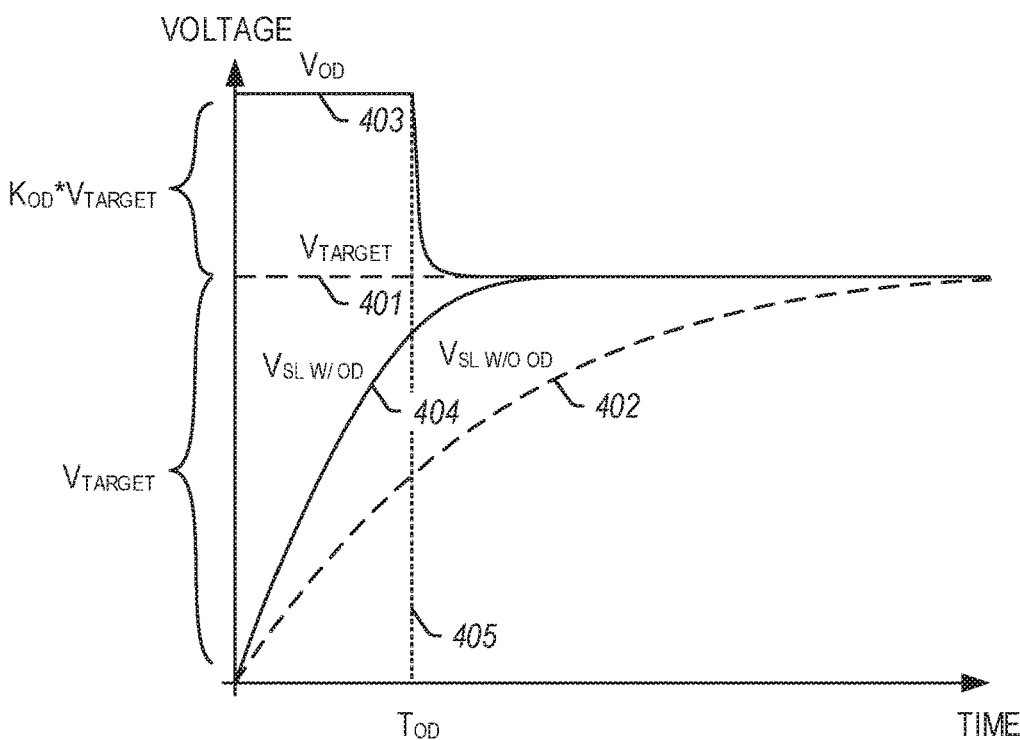
FIG. 4 illustrates example settling times of signal lines with and without overdrive.

FIG. 4 illustrates example settling times of signal lines with and without overdrive. Signal lines are often biased to a target condition (e.g., a target voltage ($V_{TARGET}$) 401, a target current, etc.) before certain memory operations (e.g., read operations, write operations, etc.) are performed. When a target voltage ($V_{TARGET}$) 401 is applied, a resulting voltage builds on the signal line ($V_{SL\ W/O\ OD}$) 402 approaching the target voltage ($V_{TARGET}$) 401 after a first period of time. The target condition can include at least one of a read bias threshold, a write bias threshold, or one or more other threshold conditions on a signal line of a memory array or a memory device. When an overdrive voltage ($V_{OD}$) 403 above the target voltage, such as by a selected increment (e.g., an overdrive coefficient ($K_{OD}$)), is applied for an overdrive period ($T_{OD}$) 405, a resulting voltage builds on the signal line ($V_{SL\ W/OD}$) 404, approaching the target voltage ($V_{TARGET}$) 401 faster than the first period of time.

Figure 5:
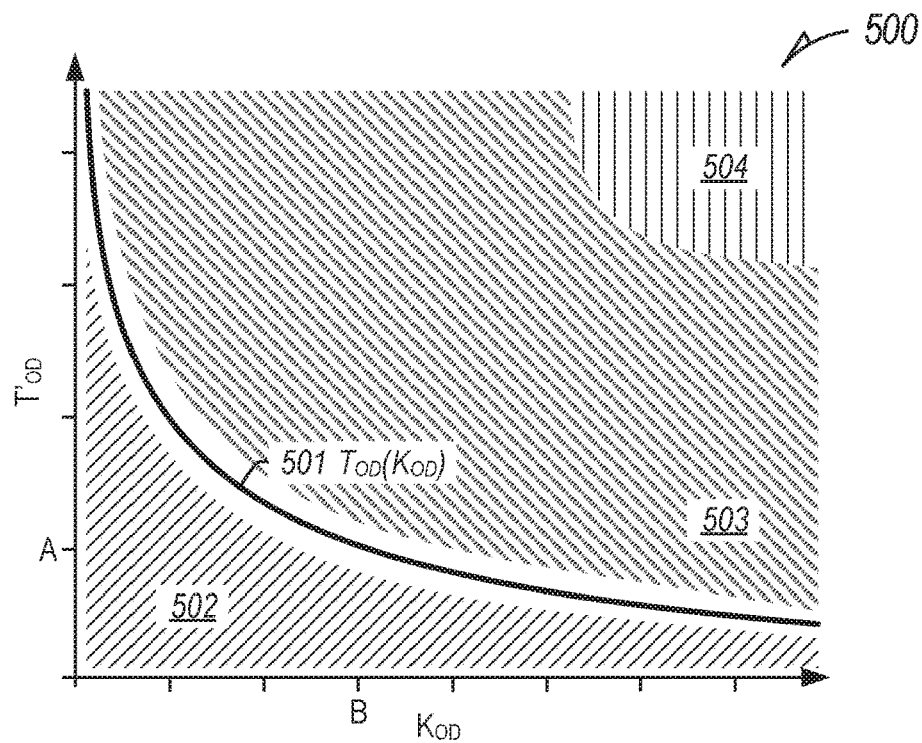
FIG. 5 illustrates an example relationship between a normalized overdrive period and an overdrive coefficient for stacked word lines in a memory array.

FIG. 5 illustrates an example relationship 500 between a normalized overdrive period ($T'_{OD}$) and an overdrive coefficient ($K_{OD}$) for stacked word lines in a memory array. The normalized overdrive period ($T'_{OD}$) is the overdrive period ($T_{OD}$) normalized by the electrical parameters of the word line ($T'_{OD}=T_{OD}/RC$); thus, such relationship is valid for any process or manufacturer across a set of storage systems or memory devices.

The present inventors have recognized a relationship between the overdrive period ($T_{OD}$) and the overdrive coefficient ($K_{OD}$) for the minimum propagation time achievable as a function of the electrical parameters (e.g., a resistance, a capacitance, etc.) of the word lines referred to herein as a line of minimum settling ($T'_{OD}(K_{OD})$) 501. Applying a specific set of $T_{OD}/K_{OD}$ values for each word line, even for word lines having different electrical parameters (e.g., due to process, location, etc.), the same (or similar) propagation delay can be achieved across all word lines. Instead of preparing for a worst-case scenario or variance across the word lines, a configurable or minimum propagation delay or settling time can be achieved across the word lines, improving or providing a configurable latency or speed of operations on the memory array.

For example, if $K_{OD}$=B, then $T'_{OD}$=A, and $T_{OD}$ can be set to A*RC to achieve a minimum settling time on the word line, regardless of process or manufacture. Where word lines across a memory array have a resistance distribution between $R_{MIN}$ and $R_{MAX}$, all resistances can be normalized by dividing by $R_{MIN}$, and will be greater than 1 and smaller than $R_{MAX}/R_{MIN}$.

In an example, word lines in a memory array can be assumed to have a constant capacitance (C). If $K_{OD}$ is fixed to B, $T_{OD}$=A*RC is an optimal $T_{OD}$ for a word line having R=$R_{MIN}$. For a word line having R=$R_{MAX}$, $T_{OD}(R_{MAX})$=$T_{OD}(R_{MIN})$*($R_{MAX}/R_{MIN}$). Accordingly, $T_{OD}$ can be scaled linearly with normalized R values. In other examples, word lines in a memory array can have varied capacitance (C). As such, $T_{OD}$ can be scaled linearly with normalized C values, $T_{OD}$*($R_{MAX}/R_{MIN}$)*($C_{MAX}/C_{MIN}$). In other examples, resistance or capacitance distributions can be transformed into a $T_{OD}$ distribution at a fixed $K_{OD}$ for the same minimized settling time on the word lines of a memory array, or into a $K_{OD}$ distribution at a fixed $T_{OD}$ for the same minimized settling time on the word lines of a memory array.

The present inventors have further recognized, among other things, that settling times are not linear across the range of $T_{OD}$ and $K_{OD}$ values. Settling times can be reduced, for example, by as much as 60% or more, at the line of minimum settling ($T'_{OD}(K_{OD})$) 501. The derivative of the settling time is higher around the line of minimum settling ($T=_{OD}(K_{OD})$) 501 than away from it. Moreover, the settling time is lower in a first zone 502 underneath the line of minimum settling ($T'_{OD}(K_{OD})$) 501 than in zones above the line of minimum settling ($T'_{OD}(K_{OD})$) 501. For example, settling time in the first zone 502 can be reduced between 0% and 40%. However, in the zones above the line of minimum settling ($T'_{OD}(K_{OD})$) 501, settling times may increase in contrast to no overdrive being applied at all, by as much as 40% in a second zone 503 or 60% or more in a third zone 504. Too much overdrive, voltage or time, can be disadvantageous. An incorrect $K_{OD}/T_{OD}$ pair for a set of RC parameters for a given word line may result in an increased settling time. There may be significant benefit in applying a proper $K_{OD}/T_{OD}$ pair to a given word line, such as using a compensation circuit.

Figure 6:
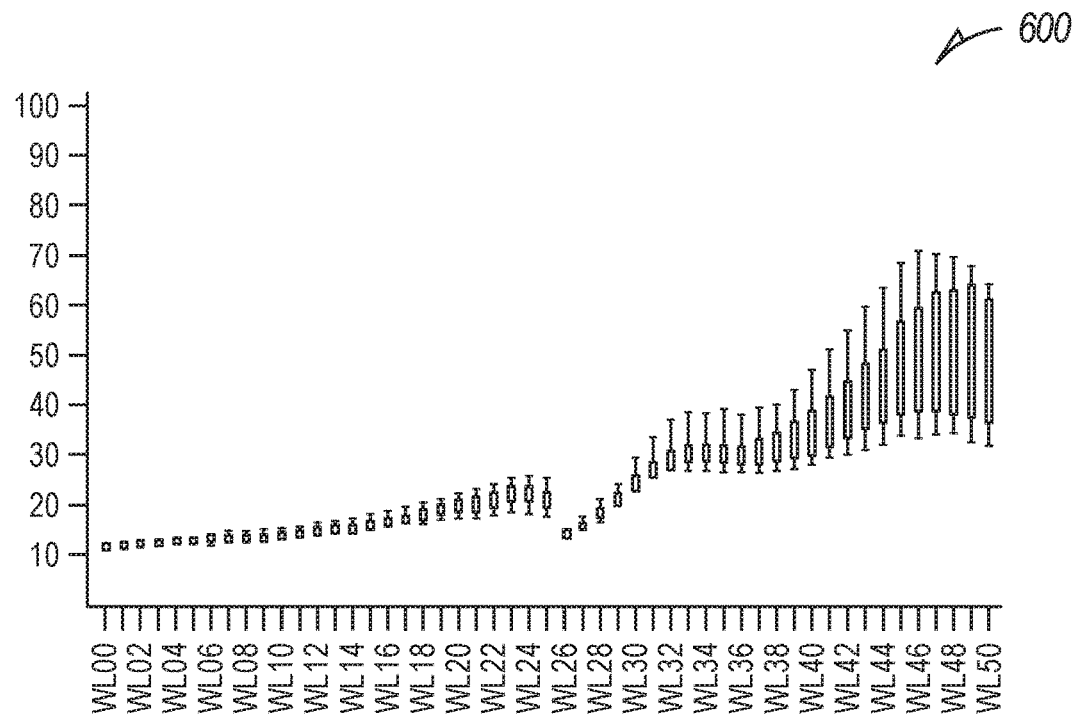
FIG. 6 illustrates an example compensation profile including trim values for a number of word lines across a number of memory arrays.

FIG. 6 illustrates an example compensation profile 600 (e.g., a box and whisker plot) including trim values for a number of word lines (e.g., word lines WL00-WL50, etc.) across a number of memory arrays. The trim value can selected to compensate for varying electrical parameters (e.g., R, C, a combination of R and C, etc.) across the word lines, and, in certain examples, can control one or more of a $K_{OD}$ or a $T_{OD}$ parameter for each word line, such as by controlling a parameter of a driver circuit (e.g., overdrive voltage, overdrive time, etc.) to reduce settling time or one or more other parameters (e.g., overdrive time or voltage variation, etc.) across the memory array. Although illustrated herein as having 100 selectable trim values, in other examples, one or more other numbers of trim values can be used, or a variable trim value can be determined and applied for each word line. The trim values can be configured to control a selectable or controllable output of a driver circuit or a time of transition, such as from a first overdrive voltage to a target condition. In other examples, the trim values can be configured to control one or more other bias signal, such as a voltage, a current, etc.

In certain examples, a pair of $K_{OD}/T_{OD}$ parameters can be determined and assigned to each word line, such as to minimize the settling time across a memory array. In other examples, a first one of the $K_{OD}/T_{OD}$ pair (e.g., $T_{OD}$) can be fixed across a memory array or a number of memory arrays in a memory system, and a second one of the $K_{OD}/T_{OD}$ pair (e.g., $K_{OD}$) can be determined and assigned to each word line. However, given the number of word lines in a memory system, the amount of information to be stored on static memory of the memory system, or elsewhere (e.g., on the host, etc.) can be large. Accordingly, determining and assigning separate parameters for each word line can be storage prohibitive as well as resource/time intensive, as the electrical parameters of each word line are measured or determined to determine the trim for each word line. For example, if $K_{OD}$ is fixed, and $T_{OD}$ has an 8-bit resolution, the number of bits required to store the $T_{OD}$ information can be 8 bits*# WL, where # WL is the number of word lines.

To reduce the amount of storage and time required to determine and apply compensation information (e.g., electrical parameters, $K_{OD}/T_{OD}$ parameters, trim values, etc.), an algorithmic function can be determined using a number of compensation techniques, in combination with or separate from fixing one of $K_{OD}$ or $T_{OD}$.

Figure 7:
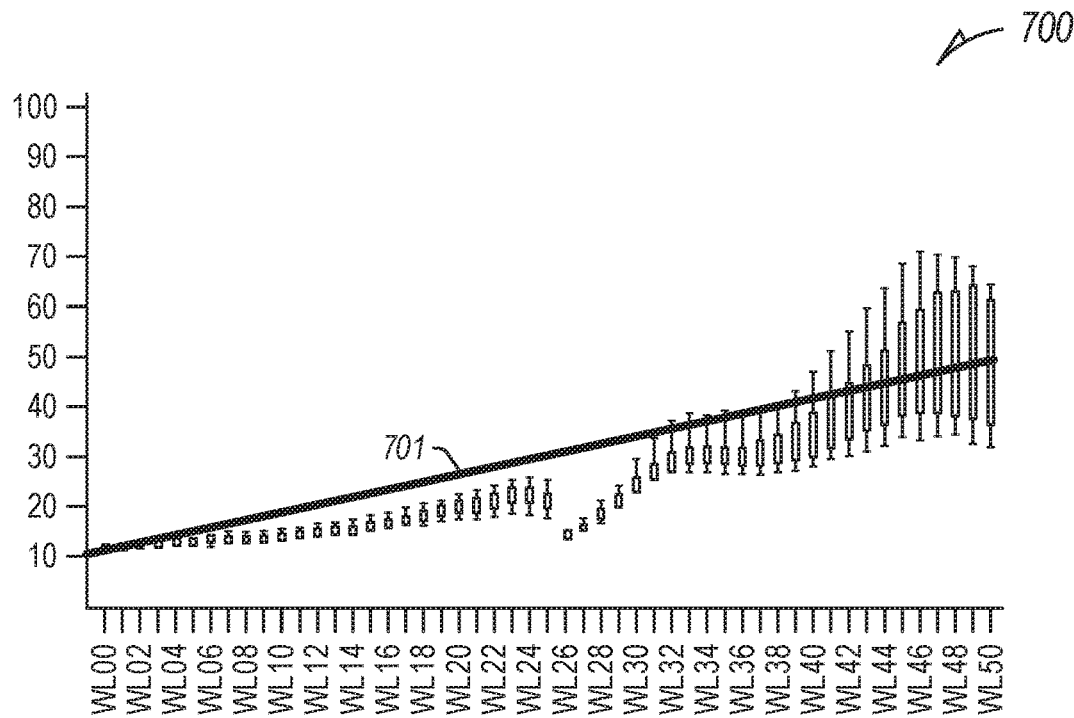
FIGS. 7-9 illustrate example functional compensation profiles determined using different compensation techniques.
Figure 8:
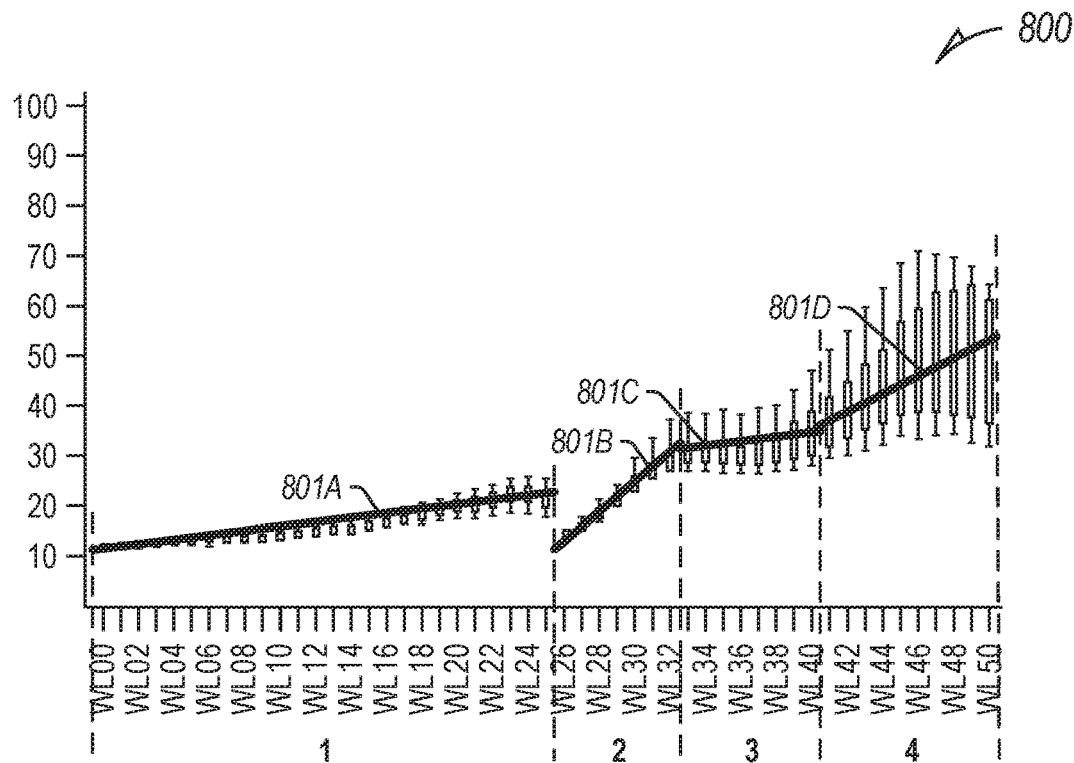
Figure 9:
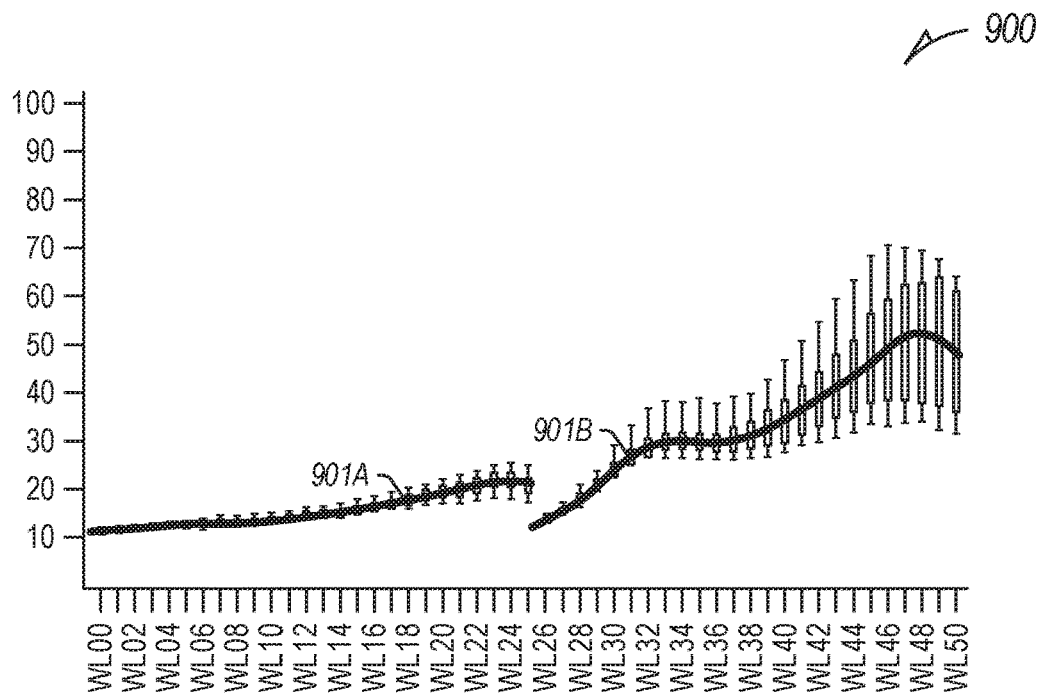

FIGS. 7-9 illustrate example functional compensation profiles 700, 800, 900 determined using different compensation techniques to account for variation across word lines of a memory device. In an example, one of $K_{OD}$ or $T_{OD}$ can be fixed, such as using the line of minimum settling ($T'_{OD}(K_{OD})$) information from FIG. 5, so that only one of $K_{OD}$ or $T_{OD}$ has to be stored. In the descriptions of FIGS. 7-9 below, it is assumed that $K_{OD}$ is fixed and $T_{OD}$ is stored, such as. However, in other examples, $T_{OD}$ can be fixed and $K_{OD}$ can be stored, or both $T_{OD}$ and $K_{OD}$ can be stored.

FIG. 7 illustrates an example segment 701 of a functional compensation profile 700 using a linear compensation technique to store $T_{OD}$. In an example, $T_{OD}$=A+B*($WL_{INDEX}$) for 0<INDEX<N, where A and B are variables that define the line of the linear technique 701, and N is the total number of word lines in the memory device. The storage required for such technique can include the sum of the resolutions of variables A and B. For example, if A and B are each 8 bits, the storage required can be 16 bits.

FIG. 8 illustrates example first, second, third, and fourth segments 801A-801D of a functional compensation profile 800 using a piece-wise linear compensation technique to store $T_{OD}$. In an example, $T_{OD}$=A+B*($WL_{INDEX}$) for 0<INDEX<N*i, where A and B are variables that define the line of the piece-wise linear compensation technique, N is the total number of word lines in the memory device, and i is the number of segments (in this example, 4). The storage required for such technique can include the sum of the resolutions of variables A and B multiplied by the number of segments. For example, if A and B are each 8 bits and there are 4 segments, the storage required can be 16*4 bits, 64 bits. To save storage space, the number of segments should be less than the number of word lines divided by 2.

FIG. 9 illustrates example first and second segments 901A, 901B of a functional compensation profile 900 using a piece-wise polynomial compensation technique to store $T_{OD}$. In an example, $T_{OD}=a_n+a_{n-1}*(WL_{INDEX})^{n-1}+\ldots$ +$a_{n-1}*(WL_{INDEX})^n$ for 0<INDEX<N*i, where N is the total number of word lines in the memory device, and i is the number of segments (in this example, 2), and n is the degree of the polynomial (in this example, 4). The storage required for such technique can include the sum of the resolution of the variable a multiplied by the number of segments and the number of variables required for the degree of the polynomial (e.g., the degree of the polynomial+1). For example, if a has a resolution of 8 bits and there are two segments degree 4 polynomials, the storage required can be 8*5*2 bits, 80 bits. The fewer the segments, the higher the degree polynomial. For example, for a degree 2 polynomial, the number of segments should be less than the number of word lines divided by 3.

In other examples, a piece-wise constant compensation technique or one or more other techniques can be used to store $T_{OD}$. The piece-wise constant compensation technique can require the sum of the resolution of a variable representing the constant times the number of segments. Other techniques can require other numbers of bits. In certain examples, multiple compensation techniques can be combined to cover a functional compensation profile, such as using different compensation techniques in different segments to reduce the storage required to cover the functional compensation profile. For example, for the first and second segments 901A, 901B illustrated in FIG. 9, a linear technique can be used to describe the first segment 901A and a polynomial compensation technique can be used to describe the second segment 901B.

In practice, determining specific values (e.g., trim values, etc.) of the functional compensation profile individually for each word line of each memory array or in each memory device may not be practical. In certain examples, the functional compensation profile can be determined to compensate for an average value of the distribution of electrical parameters (e.g., R, C, a combination thereof, etc.) for a given word line for a type of memory array or memory device, and not for individual variance across multiple memory arrays or memory devices. In an example, the compensators can be targeted at systemic process effects to word-line electrical parameters and variances, and not to the specific random impacts to a specific memory array or memory device.

Moreover, compensation can be more effective when RMAX/RMIN>>1 across a segment, number of segments, or all word lines of a memory array, memory device, or a functional compensation profile. Such compensation can relieve the cost of memory device manufacturing and process, as expensive process control techniques to limit wide variations of word line electrical parameters can be avoided if they can otherwise be compensated for. In certain examples, consistent variation in electrical parameters across memory arrays or memory devices (e.g., variation specificity), from a compensation perspective, can be more advantageous than the magnitude of the variance in a specific device (e.g., variation sensitivity). Accordingly, use of such compensation techniques can reduce design, process, and manufacture time, as well as the time to market for high-performing memory devices.

Figure 10:
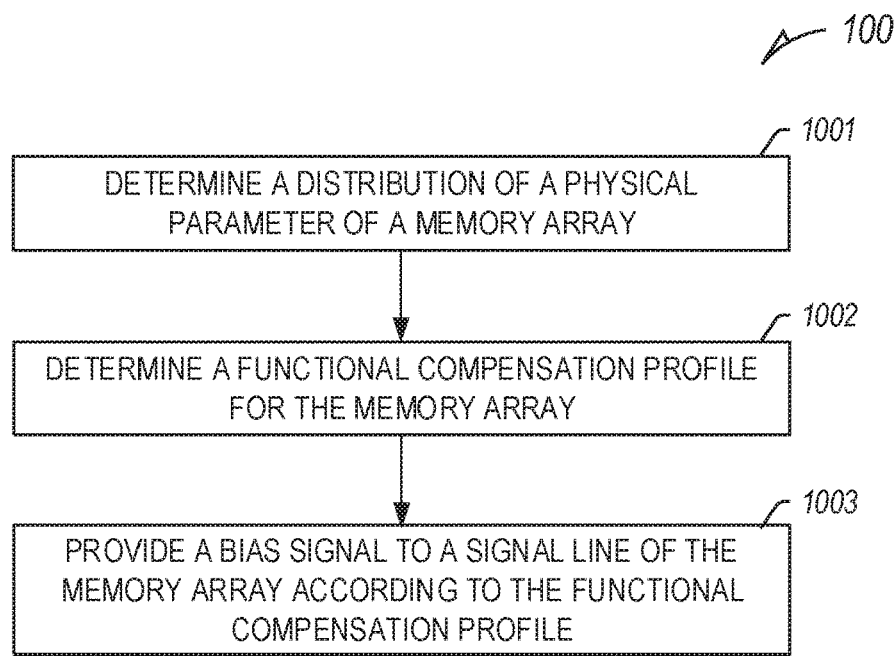
FIG. 10 illustrates an example method to compensate for variance in an electrical parameter across a number of signal lines of a memory array.

FIG. 10 illustrates an example method 1000 to compensate for variance in an electrical parameter (e.g., R, C, both of R and C, etc.) across a number of signal lines (e.g., word lines) of a memory array. In certain examples, a relationship between an overdrive voltage (e.g., the product of a target condition (e.g., a target voltage ($V_{TARGET}$)) and an overdrive coefficient ($K_{OD}$), $V_{OD}$) and an overdrive period can be determined, such as using a compensation circuit or one or more components of a memory system, a host system, or an external system or process. Propagation and settling times can be optimized using the determined relationship as a function of the electrical parameters of the signal line.

At 1001, a distribution of a physical parameter of a memory array is determined, such as using a compensation circuit, etc. In an example, a resistance distribution across the memory array can be determined, such as $R_{MAX}$ and $R_{MIN}$ across signal lines of the memory array, etc. In other examples, select values of different signal lines can be determined, and a distribution can be inferred using the determined values. In other examples, one or more other parameters can be determined, such as capacitance, etc. In certain examples, an indication of a distribution can be received, and one or more component or parameter of the distribution can be determined using the received indication. In other examples, the distribution can be received, such as from one or more other circuits or processes.

At 1002, a functional compensation profile is determined for a memory array, such as using a compensation circuit. In an example, the functional compensation profile can be determined using a relationship between an overdrive period ($T_{OD}$) and an overdrive coefficient ($K_{OD}$). In other examples, determining the functional compensation profile can include determining the relationship between the overdrive period and the overdrive coefficient for a specific memory array or memory system, or for a type of memory array, system, or device. Once the relationship between the overdrive period and the overdrive coefficient is determined, the functional compensation profile can be determined for the memory array, such as by setting a first one of the overdrive coefficient or the overdrive period to a constant and determining a range of a second one of the overdrive coefficient or the overdrive period according to an electrical parameter of the memory array, such as an electrical parameter of one or more signal lines (e.g., word lines) of the memory array.

In an example, the electrical parameter can include a resistance (R), a capacitance C), or one or more other electrical parameters of the memory array, including a resistance or a capacitance of one or more signal lines of the array of memory cells. Depending on the desired storage parameters and performance, an electrical parameter of one or more signal lines can be determined across the array of memory cells. In an example, a resistance distribution across the memory array can be determined, such as $R_{MAX}$ and $R_{MIN}$ values across the signal lines. In other examples, electrical parameters for a select number of signal lines of a memory array can be determined, and the functional compensation profile can be determined using those determined select values.

For example, for the functional compensation profile in FIG. 6, if a constant capacitance is assumed, resistance variation of the signal lines drives the shape of the functional compensation profile. If the shape is known, a select number of resistances can be measured to determine the overall functional compensation profile, depending on the desired compensation technique. For example, if a linear compensation technique is desired with a single segment, resistances of the first and least word lines can be measured to determine the functional compensation profile. In other examples, electrical parameters of more or other word lines can be measured to determine the functional compensation profile.

At 1003, a bias signal can be provided, such as by a bias circuit of a row decoder or a column decoder, to a signal line of the memory array according to the functional compensation profile. In an example, the bias circuit can be a component of a row decoder, and the signal line can include a word line. In certain examples, the functional compensation profile can be determined by a compensation circuit and stored in memory, such as read-only memory of a memory system or one or more other memory arrays or devices. The compensation circuit can control application of the bias signal and bias signal parameters (e.g., an overdrive coefficient, an overdrive period, etc.) to the signal line.

Figure 11:
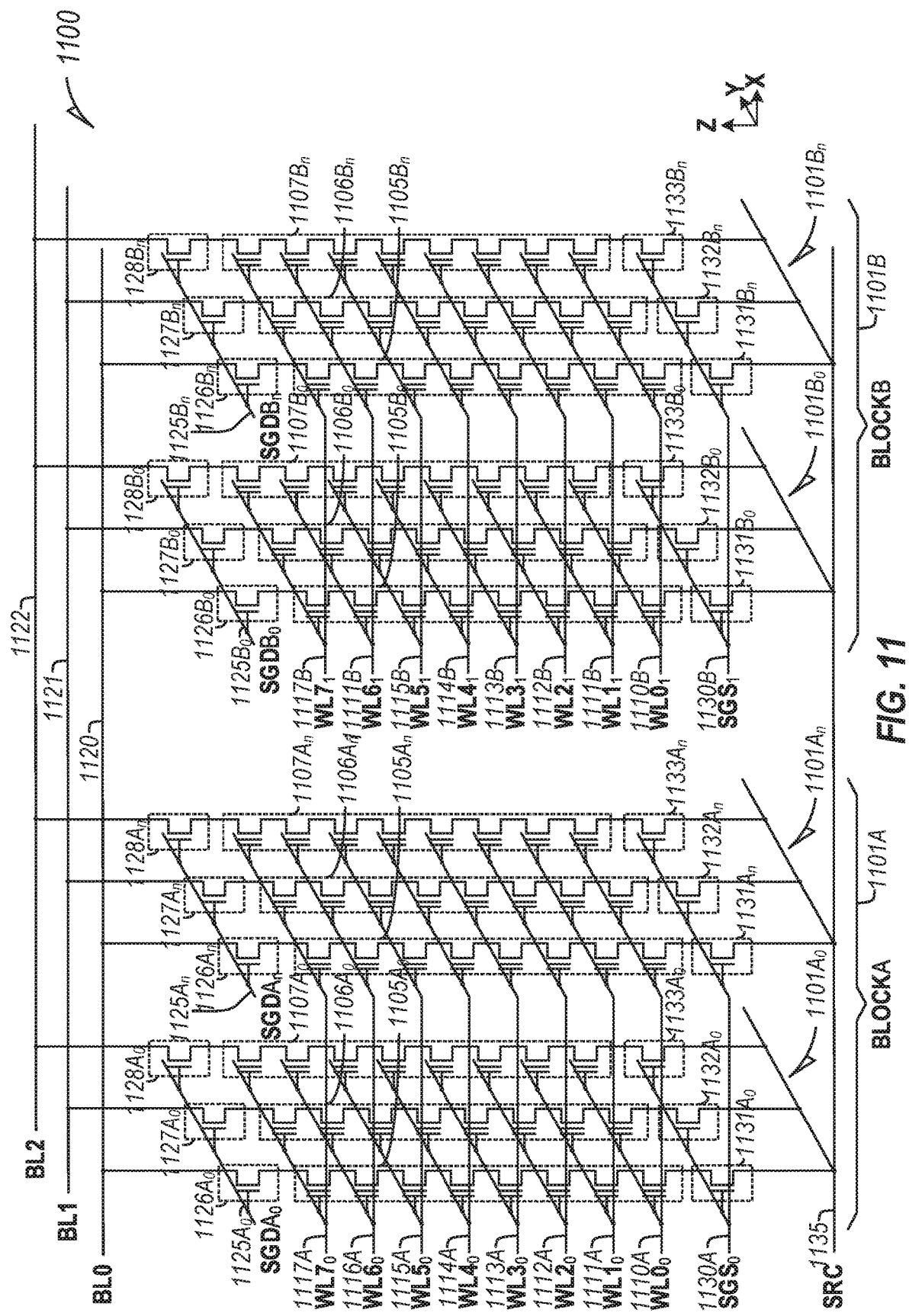
FIG. 11 illustrates an example schematic diagram of a 3D NAND architecture semiconductor memory array.

FIG. 11 illustrates an example schematic diagram of a 3D NAND architecture semiconductor memory array 1100 including a number of strings of memory cells (e.g., first-third $A_0$ memory strings 1105$A_0$-1107$A_0$, first-third $A_n$ memory strings 1105$A_n$-1107$A_n$, first-third $B_0$ memory strings 1105$B_0$-1107$B_0$, first-third $B_n$ memory strings 1105$B_n$-1107$B_n$, etc.), organized in blocks (e.g., block A 1101A, block B 1101B, etc.) and sub-blocks (e.g., sub-block $A_0$ 1101$A_0$, sub-block $A_n$ 1101$A_n$, sub-block $B_0$ 1101$B_0$, sub-block $B_n$ 1101$B_n$, etc.). The memory array 1100 represents a portion of a greater number of similar structures that would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 1135 or a source-side select gate (SGS) (e.g., first-third $A_0$ SGS 1131$A_0$-1133$A_0$, first-third $A_n$ SGS 1131$A_n$-1133$A_n$, first-third $B_0$ SGS 1131$B_0$-1133$B_0$, first-third $B_n$ SGS 1131$B_n$-1133$B_n$, etc.) and a drain-side select gate (SGD) (e.g., first-third $A_0$ SGD 1126$A_0$-1128$A_0$, first-third $A_n$ SGD 1126$A_n$-1128$A_n$, first-third $B_0$ SGD 1126$B_0$-1128$B_0$, first-third $B_n$ SGD 1126$B_n$-1128$B_n$, etc.). Each string of memory cells in the 3D memory array can be arranged along the X direction as data lines (e.g., bit lines (BL) BL0-BL6 1120-1122), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, each block having two sub-blocks, each sub-block having a single physical page, each physical page having three strings of memory cells, and each string having 8 tiers of memory cells, in other examples, the memory array 1100 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 1100 includes a control gate (CG) coupled to (e.g., electrically or otherwise operatively connected to) an access line (e.g., word lines (WL) WL$0_0$-WL$7_0$ 1110A-1117A, WL$0_1$-WL$7_1$1110B-1117B, etc.), which collectively couples the control gates (CGs) across a specific tier, or a portion of a tier, as desired. Specific tiers in the 3D memory array, and accordingly, specific memory cells in a string, can be accessed or controlled using respective access lines. Groups of select gates can be accessed using various select lines. For example, first-third $A_0$ SGD 1126$A_0$-1128$A_0$ can be accessed using an $A_0$ SGD line SGDA$_0$ 1125$A_0$, first-third $A_n$ SGD 1126$A_n$-1128$A_n$ can be accessed using an $A_n$ SGD line SGDA$_n$ 1125$A_n$, first-third $B_0$ SGD 1126$B_0$-1128$B_0$ can be accessed using a $B_0$ SGD line SGDB$_0$ 1125$B_0$, and first-third $B_n$ SGD 1126$B_n$-1128$B_n$ can be accessed using a $B_n$ SGD line SGDB$_n$ 1125$B_n$. First-third $A_0$ SGS 1131$A_0$-1133$A_0$ and first-third $A_n$ SGS 1131$A_n$-1133$A_n$ can be accessed using a gate select line SGS$_0$ 1130A, and first-third $B_0$ SGS 1131$B_0$-1133$B_0$ and first-third $B_n$ SGS 1131$B_n$-1133$B_n$ can be accessed using a gate select line SGS$_1$ 1130B.

In an example, the memory array 1100 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

In a NAND architecture semiconductor memory array, the state of a selected memory cell can be accessed by sensing a current or voltage variation associated with a particular data line containing the selected memory cell. The memory array 1100 can be accessed (e.g., by a control circuit, one or more processors, digital logic, etc.) using one or more driver circuits. In an example, one or more driver circuits can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL$4_0$), and thus, to a control gate of each memory cell coupled to the selected word lines. Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as WL$4_0$, a pass voltage of 10V can be applied to one or more other word lines, such as WL$3_0$, WL$5_0$, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to $WL4_0$, a pass voltage of 10V can be applied to $WL3_0$ and $WL5_0$, a pass voltage of 8V can be applied to $WL2_0$ and $WL6_0$, a pass voltage of 7V can be applied to $WL1_0$ and $WL7_0$, etc. In other examples, the pass voltages, or number of word lines, etc., can be higher or lower, or more or less.

Sense amplifiers can be coupled to one or more of the data lines (e.g., first, second, or third bit lines (BL0-BL2) 1120-1122), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

Figure 12:
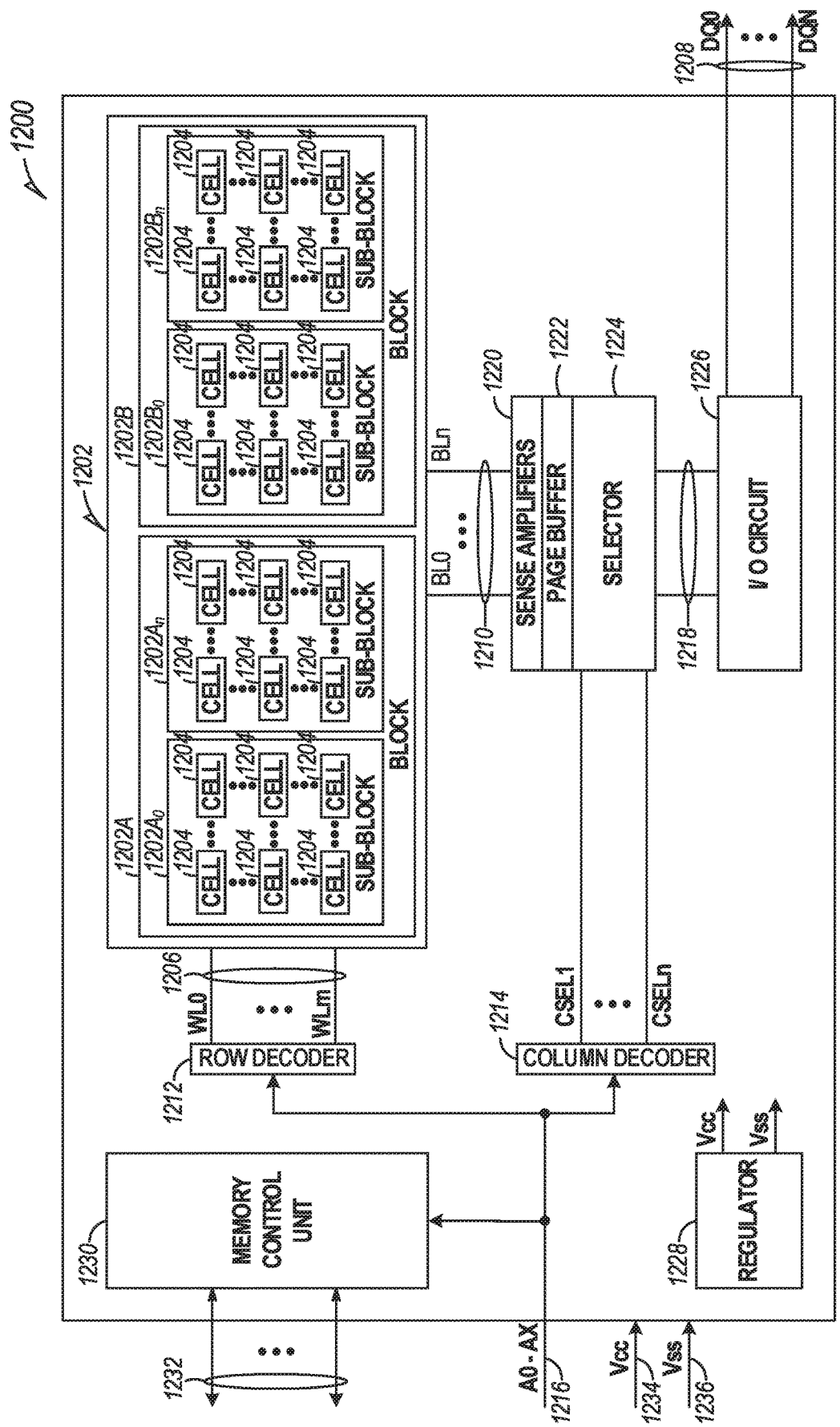
FIG. 12 illustrates an example block diagram of a memory module.

FIG. 12 illustrates an example block diagram of a memory device 1200 including a memory array 1202 having a plurality of memory cells 1204, and one or more circuits or components to provide communication with, or perform one or more memory operations on, the memory array 1202. Although shown with a single memory array 1202, in other examples, one or more additional memory arrays, dies, or LUNs can be included herein. In certain examples, in a storage system having a number of dies or LUNs, the memory device 1200 can represent a block diagram of circuits and components for each die or LUN. The memory device 1200 can include a row decoder 1212, a column decoder 1214, sense amplifiers 1220, a page buffer 1222, a selector 1224, an input/output (I/O) circuit 1226, a memory control unit 1230, and one or more driver circuits configured to provide a bias signal to one or more signal lines (e.g., one or more access lines 1206, one or more data lines 1210, etc.). In an example, the row decoder 1212 and the column decoder 1214 can include one or more driver circuits.

The memory cells 1204 of the memory array 1202 can be arranged in blocks, such as first and second blocks 1202A, 1202B. Each block can include sub-blocks. For example, the first block 1202A can include first and second sub-blocks $1202A_0$, $1202A_n$, and the second block 1202B can include first and second sub-blocks $1202B_0$, $1202B_n$. Each sub-block can include a number of physical pages, each page including a number of memory cells 1204. Although illustrated herein as having two blocks, each block having two sub-blocks, and each sub-block having a number of memory cells 1204, in other examples, the memory array 1202 can include more or fewer blocks, sub-blocks, memory cells, etc. In other examples, the memory cells 1204 can be arranged in a number of rows, columns, pages, sub-blocks, blocks, etc., and accessed using, for example, access lines 1206, first data lines 1210, or one or more select gates, source lines, etc.

The memory control unit 1230 can control memory operations of the memory device 1200 according to one or more signals or instructions received on control lines 1232, including, for example, one or more clock signals or control signals that indicate a desired operation (e.g., write, read, erase, etc.), or address signals (A0-AX) received on one or more address lines 1216. One or more devices external to the memory device 1200 can control the values of the control signals on the control lines 1232, or the address signals on the address line 1216. Examples of devices external to the memory device 1200 can include, but are not limited to, a host, a memory controller, a processor, or one or more circuits or components not illustrated in FIG. 12.

The memory device 1200 can use access lines 1206 and first data lines 1210 to transfer data to (e.g., write or erase) or from (e.g., read) one or more of the memory cells 1204. The row decoder 1212 and the column decoder 1214 can receive and decode the address signals (A0-AX) from the address line 1216, can determine which of the memory cells 1204 are to be accessed, and can provide signals to one or more of the access lines 1206 (e.g., one or more of a plurality of word lines (WL0-WLm)) or the first data lines 1210 (e.g., one or more of a plurality of bit lines (BL0-BLn)), such as described above.

The memory device 1200 can include sense circuitry, such as the sense amplifiers 1220, configured to determine the values of data on (e.g., read), or to determine the values of data to be written to, the memory cells 1204 using the first data lines 1210. For example, in a selected string of memory cells 1204, one or more of the sense amplifiers 1220 can read a logic level in the selected memory cell 1204 in response to a read current flowing in the memory array 1202 through the selected string to the data lines 1210.

One or more devices external to the memory device 1200 can communicate with the memory device 1200 using the I/O lines (DQ0-DQN) 1208, address lines 1216 (A0-AX), or control lines 1232. The input/output (I/O) circuit 1226 can transfer values of data in or out of the memory device 1200, such as in or out of the page buffer 1222 or the memory array 1202, using the I/O lines 1208, according to, for example, the control lines 1232 and address lines 1216. The page buffer 1222 can store data received from the one or more devices external to the memory device 1200 before the data is programmed into relevant portions of the memory array 1202, or can store data read from the memory array 1202 before the data is transmitted to the one or more devices external to the memory device 1200.

The column decoder 1214 can receive and decode address signals (A0-AX) into one or more column select signals (CSEL1-CSELn). The selector 1224 (e.g., a select circuit) can receive the column select signals (CSEL1-CSELn) and select data in the page buffer 1222 representing values of data to be read from or to be programmed into memory cells 1204. Selected data can be transferred between the page buffer 1222 and the I/O circuit 1226 using second data lines 1218.

The memory control unit 1230 can receive positive and negative supply signals, such as a supply voltage (Vcc) 1234 and a negative supply (Vss) 1236 (e.g., a ground potential), from an external source or supply (e.g., an internal or external battery, an AC-to-DC converter, etc.). In certain examples, the memory control unit 1230 can include a regulator 1228 to internally provide positive or negative supply signals.

Figure 13:
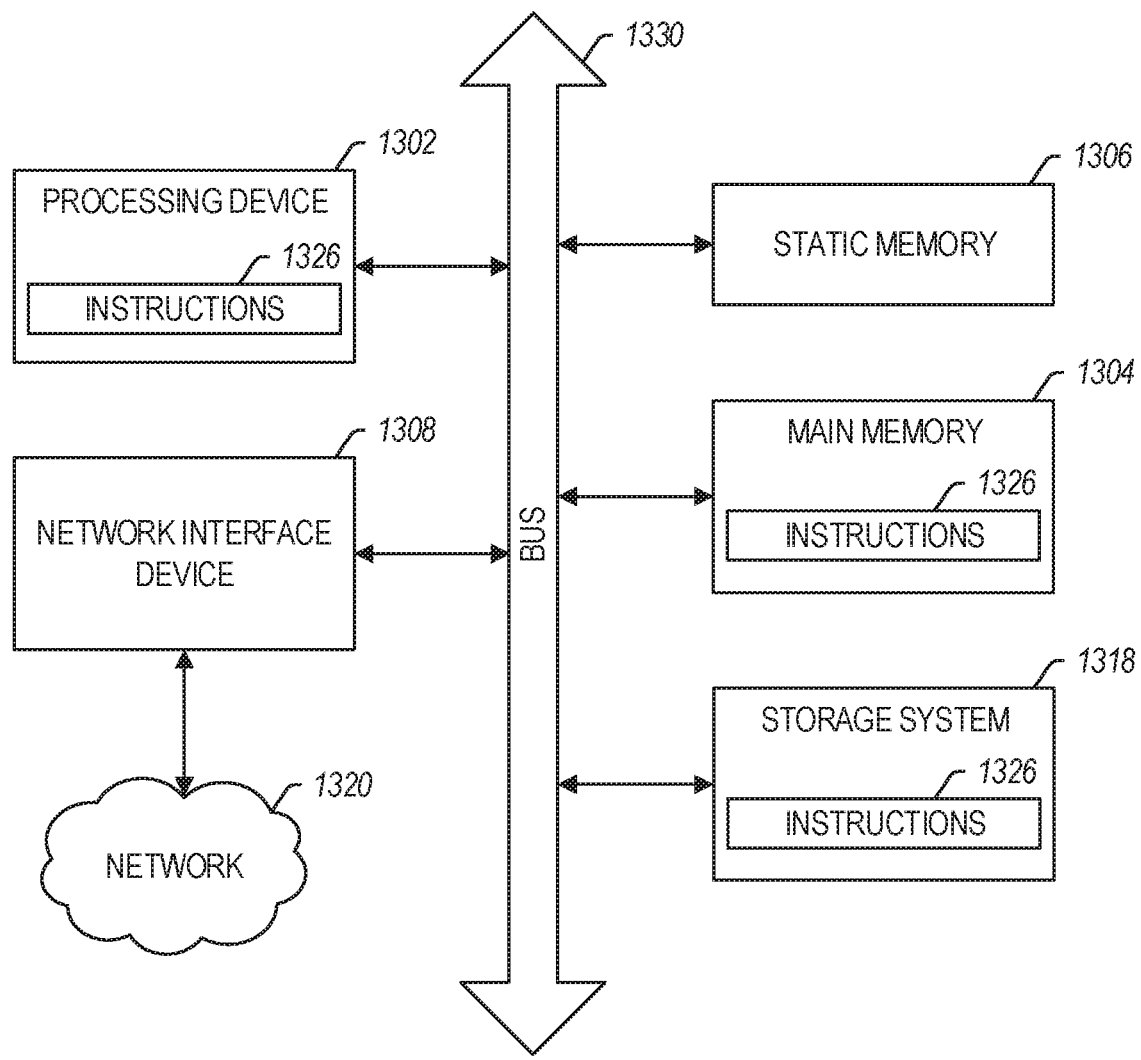
FIG. 13 illustrates a block diagram of an example machine upon which any one or more of the techniques discussed herein may perform.

FIG. 13 illustrates a block diagram of an example machine 1300 upon which any one or more of the techniques (e.g., methodologies) discussed herein may perform, such as triggering a CSAVE operation in a memory device (e.g., an NVDIMM) using a timer implemented using a memory controller of the NVDIMM. In alternative embodiments, the machine 1300 may operate as a standalone device or may be connected (e.g., networked) to other machines. In a networked deployment, the machine 1300 may operate in the capacity of a server machine, a client machine, or both in server-client network environments. In an example, the machine 1300 may act as a peer machine in peer-to-peer (P2P) (or other distributed) network environment. The machine 1300 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, movable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 1300 (e.g., the host 105, the storage system 110, etc.) may include a hardware processor 1302 (e.g., a central processing unit (CPU), a graphics processing unit (GPU), a hardware processor core, or any combination thereof, such as a memory controller, etc.), a main memory 1304 and a static memory 1306, some or all of which may communicate with each other via an interlink (e.g., bus) 1330. The machine 1300 may further include a display unit, an alphanumeric input device (e.g., a keyboard), and a user interface (UI) navigation device (e.g., a mouse). In an example, the display unit, input device and UI navigation device may be a touch screen display. The machine 1300 may additionally include a signal generation device (e.g., a speaker), a network interface device 1308, and one or more sensors, such as a global positioning system (GPS) sensor, compass, accelerometer, or other sensor. The machine 1300 may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The machine 1300 may include a storage system (e.g., a machine-readable medium) on which is stored one or more sets of data structures or instructions 1326 (e.g., software) embodying or utilized by any one or more of the techniques or functions described herein. The instructions 1326 may also reside, completely or at least partially, within the main memory 1304, within static memory 1306, or within the hardware processor 1302 during execution thereof by the machine 1300. In an example, one or any combination of the hardware processor 1302, the main memory 1304, the static memory 1306, or the storage system 1318 may constitute a machine-readable medium. The term "machine-readable medium" may include a single medium or multiple media (e.g., a centralized or distributed database, or associated caches and servers) configured to store the one or more instructions 1326.

The term "machine-readable medium" may include any medium that is capable of storing, encoding, or carrying instructions for execution by the machine 1300 and that cause the machine 1300 to perform any one or more of the techniques of the present disclosure, or that is capable of storing, encoding, or carrying data structures used by or associated with such instructions. Non-limiting machine-readable medium examples may include solid-state memories, and optical and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 1326 (e.g., software, programs, an operating system (OS), etc.) or other data are stored on the storage system 1318, can be accessed by the memory 1304 for use by the processor 1302. The memory 1304 (e.g., DRAM) is typically fast, but volatile, and thus a different type of storage than the storage system 1318 (e.g., an SSD), which is suitable for long-term storage, including while in an "off" condition. The instructions 1326 or data in use by a user or the machine 1300 are typically loaded in the memory 1304 for use by the processor 1302. When the memory 1304 is full, virtual space from the storage system 1318 can be allocated to supplement the memory 1304; however, because the storage system 1318 device is typically slower than the memory 1304, and write speeds are typically at least twice as slow as read speeds, use of virtual memory can greatly reduce user experience due to storage device latency (in contrast to the memory 1304, e.g., DRAM). Further, use of the storage system 1318 for virtual memory can greatly reduce the usable lifespan of the storage system 1318.

In contrast to virtual memory, virtual memory compression (e.g., the Linux™ kernel feature "ZRAM") uses part of the memory as compressed block storage to avoid paging to the storage system 1318. Paging takes place in the compressed block until it is necessary to write such data to the storage system 1318. Virtual memory compression increases the usable size of memory 1304, while reducing wear on the storage system 1318.

Storage systems optimized for mobile electronic devices, or mobile storage, traditionally include MMC solid-state storage systems (e.g., micro Secure Digital (microSD™) cards, etc.). MMC devices include a number of parallel interfaces (e.g., an 8-bit parallel interface) with a host, and are often removable and separate components from the host. In contrast, eMMC™ devices are attached to a circuit board and considered a component of the host, with read speeds that rival serial ATA™ (Serial AT (Advanced Technology) Attachment, or SATA) based SSD devices. However, demand for mobile device performance continues to improve, such as to fully enable virtual or augmented-reality devices, utilize increasing networks speeds, etc. In response to this demand, storage systems have shifted from parallel to serial communication interfaces. Universal Flash Storage (UFS) devices, including controllers and firmware, communicate with a host using a low-voltage signaling interface, such as a Scalable Low-Voltage Signaling (SLVS) interface with dedicated read/write paths, further increasing read/write speeds.

The instructions 1326 may further be transmitted or received over a communications network 1320 using a transmission medium via the network interface device 1308 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 1308 may include one or more physical jacks (e.g., Ethernet, coaxial, or phone jacks) or one or more antennas to connect to the communications network 1320. In an example, the network interface device 1308 may include a plurality of antennas to wirelessly communicate using at least one of single-input multiple-output (SIMO), multiple-input multiple-output (MINX)), or multiple-input single-output (MISO) techniques. The term "transmission medium" shall be taken to include any intangible medium that is capable of storing, encoding, or carrying instructions for execution by the machine 1300, and includes digital or analog communications signals or other intangible medium to facilitate communication of such software.

In Example 1, subject matter (e.g., a system) may comprise an array of memory cells including a number of signal lines (e.g., word lines, bit lines, etc.), each signal line configured to provide access to a number of memory cells responsive to a bias condition of the respective signal line; and a compensation circuit configured to provide a bias signal to a first one of the number of signal lines, the bias signal having a magnitude greater than a magnitude of a target condition by an overdrive coefficient for an overdrive period according to a functional compensation profile, wherein the functional compensation profile comprises a distribution of one of the overdrive coefficient or the overdrive period across the number of signal lines to compensate for variance in an electrical parameter across the number of signal lines.

In Example 2, the subject matter of Example 1 may optionally be configured such that the functional compensation profile comprises: a first one of the overdrive coefficient or the overdrive period fixed to a constant value; and a distribution of a second one of the overdrive coefficient or the overdrive period across the number of signal lines to compensate for variance in the electrical parameter across the number of signal lines.

In Example 3, the subject matter of any one or more of Examples 1-2 may optionally be configured such that the functional compensation profile comprises: a fixed overdrive coefficient; and a distribution of the overdrive period across the number of signal lines to compensate for variance in the electrical parameter across the number of signal lines.

In Example 4, the subject matter of any one or more of Examples 1-3 may optionally be configured such that the functional compensation profile comprises: a fixed overdrive period; and a distribution of the overdrive coefficient across the number of signal lines to compensate for variance in the electrical parameter across the number of signal lines.

In Example 5, the subject matter of any one or more of Examples 1-4 may optionally be configured such that the target condition comprises a bias threshold voltage configured to be applied to the first signal line prior to performing a memory operation.

In Example 6, the subject matter of any one or more of Examples 1-5 may optionally be configured such that the functional compensation profile comprises a number of trim values distributed across the number of signal lines using at least one of: a linear function; a piece-wise constant function; a piece-wise linear function; or a piece-wise polynomial function.

In Example 7, the subject matter of any one or more of Examples 1-6 may optionally be configured such that the compensation circuit is configured to determine the functional compensation profile for the array of memory cells using a relationship between the overdrive coefficient and the overdrive period to reduce a settling time of the target condition on the number of signal lines.

In Example 8, the subject matter of any one or more of Examples 1-7 may optionally be configured to comprise a memory device, wherein the memory device comprises a number of arrays of non-volatile memory cells according to a first manufacturer or process, wherein the functional compensation profile is determined for the memory device according to the first manufacturer or process.

In Example 9, the subject matter of any one or more of Examples 1-8 may optionally be configured such that the compensation circuit is configured to determine the functional compensation profile for the array of memory cells using a relationship between the overdrive coefficient and the overdrive period and an electrical characteristic of the array of memory cells.

In Example 10, the subject matter of any one or more of Examples 1-9 may optionally be configured such that the electrical characteristic of the array of memory cells comprises at least one of a resistance or a capacitance of at least one of the number of signal lines.

In Example 11, the subject matter of any one or more of Examples 1-10 may optionally be configured such that the electrical characteristic of the array of memory cells comprises a range of resistances across the number of signal lines.

In Example 12, subject matter (e.g., a method) may comprise providing, using a compensation circuit, a bias signal to a first one of a number of signal lines of an array of memory cells to access a number of memory cells responsive to a bias condition of the first signal line, the bias signal has a magnitude greater than a magnitude of a target condition by an overdrive coefficient for an overdrive period according to a functional compensation profile, wherein the functional compensation profile comprises a distribution of one of the overdrive coefficient or the overdrive period across the number of signal lines to compensate for variance in an electrical parameter across the number of signal lines.

In Example 13, the subject matter of Example 12 may optionally be configured such that the functional compensation profile comprises: a first one of the overdrive coefficient or the overdrive period fixed to a constant value; and a distribution of a second one of the overdrive coefficient or the overdrive period across the number of signal lines to compensate for variance in the electrical parameter across the number of signal lines, wherein the target condition comprises a bias threshold voltage configured to be applied to the first signal line prior to performing a memory operation.

In Example 14, the subject matter of any one or more of Examples 12-13 may optionally be configured such that the functional compensation profile comprises: a fixed overdrive coefficient; and a distribution of the overdrive period across the number of signal lines to compensate for variance in the electrical parameter across the number of signal lines.

In Example 15, the subject matter of any one or more of Examples 12-14 may optionally be configured such that the functional compensation profile comprises: a fixed overdrive period; and a distribution of the overdrive coefficient across the number of signal lines to compensate for variance in the electrical parameter across the number of signal lines.

In Example 16, the subject matter of any one or more of Examples 12-15 may optionally be configured such that the functional compensation profile comprises a number of trim values distributed across the number of signal lines using at least one of: a linear function; a piece-wise constant function; a piece-wise linear function; or a piece-wise polynomial function.

In Example 17, the subject matter of any one or more of Examples 12-16 may optionally be configured to comprise determining the functional compensation profile for the array of memory cells using a relationship between the overdrive coefficient and the overdrive period to reduce a settling time of the target condition on the number of signal lines.

In Example 18, the subject matter of any one or more of Examples 12-17 may optionally be configured to comprise determining the functional compensation profile for the array of memory cells using a relationship between the overdrive coefficient and the overdrive period and an electrical characteristic of the array of memory cells.

In Example 19, the subject matter of any one or more of Examples 12-18 may optionally be configured such that the electrical characteristic of the array of memory cells comprises at least one of a resistance or a capacitance of at least one of the number of signal lines.

In Example 20, the subject matter of any one or more of Examples 12-19 may optionally be configured such that the electrical characteristic of the array of memory cells comprises a range of resistances across the number of signal lines.

In Example 21, subject matter (e.g., a system or apparatus) may optionally combine any portion or combination of any portion of any one or more of Examples 1-20 to comprise "means for" performing any portion of any one or more of the functions or methods of Examples 1-20, or a "non-transitory machine-readable medium" including instructions that, when performed by a machine, cause the machine to perform any portion of any one or more of the functions or methods of Examples 1-20.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended. A system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

It will be understood that when an element is referred to as being "on," "connected to," or "coupled with" another element, it can be directly on, connected, or coupled with the other element or intervening elements may be present. In contrast, when an element is referred to as being "directly on," "directly connected to," or "directly coupled with" another element, there are no intervening elements or layers present. If two elements are shown in the drawings with a line connecting them, the two elements can be either be coupled, or directly coupled, unless otherwise indicated.

Method examples described herein can be machine, device, or computer-implemented at least in part. Some examples can include a computer-readable medium, a device-readable medium, or a machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMS), read only memories (ROMs), solid state drives (SSDs), Universal Flash Storage (UFS) device, embedded MMC (eMMC) device, and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A system comprising:
an array of memory cells including multiple signal lines, each signal line configured to provide access to a group of memory cells responsive to a bias condition of the respective signal line; and
a compensation circuit configured to provide a respective bias signal to each of the multiple signal lines, each respective bias signal having an overdrive voltage greater than a target voltage by a selected increment and for a selected overdrive period according to a functional compensation profile,
wherein the functional compensation profile comprises:
a first one of the selected increment or the selected overdrive period fixed to a constant value; and
a stored distribution of a second one of the selected increment or the selected overdrive period across the multiple signal lines to compensate for variance in an electrical parameter across the multiple signal lines.

2. The system of claim 1, wherein the functional compensation profile comprises:
a fixed selected increment; and
a distribution of the selected overdrive period across the multiple signal lines to compensate for variance in the electrical parameter across the multiple signal lines.

3. The system of claim 1, wherein the functional compensation profile comprises:
a fixed selected overdrive period; and
a distribution of the selected increment across the multiple signal lines to compensate for variance in the electrical parameter across the multiple signal lines.

4. The system of claim 1, wherein the target voltage comprises a bias threshold voltage configured to be applied to a first signal line prior to performing a memory operation.

5. The system of claim 1, wherein the functional compensation profile comprises multiple trim values distributed across the multiple signal lines using at least one of:
a linear function;
a piece-wise constant function;
a piece-wise linear function; or
a piece-wise polynomial function.

6. The system of claim 1, wherein the compensation circuit is configured to determine the functional compensation profile for the array of memory cells using a relationship between the selected increment and the selected overdrive period to reduce a settling time of the target voltage on the multiple signal lines.

7. The system of claim 6, comprising a memory device, wherein the memory device comprises multiple arrays of non-volatile memory cells,
wherein the functional compensation profile is determined for a set of memory devices including the memory device.

8. The system of claim 1, wherein the compensation circuit is configured to determine the functional compensation profile for the array of memory cells using a relationship between the selected increment and the selected overdrive period and an electrical characteristic of the array of memory cells.

9. The system of claim 8, wherein the electrical characteristic of the array of memory cells comprises at least one of a resistance or a capacitance of at least one of the multiple signal lines.

10. The system of claim 8, wherein the electrical characteristic of the array of memory cells comprises a range of resistances across the multiple signal lines.

11. A method comprising:
   providing, using a compensation circuit, a respective bias signal to a first signal line of multiple signal lines of an array of memory cells to access a group of memory cells responsive to a bias condition of the first signal line, the bias signal having an overdrive voltage greater than a target voltage by a selected increment for a selected overdrive period according to a functional compensation profile,
   wherein the functional compensation profile comprises:
      a first one of the selected increment or the selected period fixed to a constant value; and
      a distribution of a second one of the selected increment or the selected overdrive period across the multiple signal lines to compensate for variance in an electrical parameter across the multiple signal lines.

12. The method of claim 11,
   wherein the target voltage comprises a bias threshold voltage configured to be applied to first signal line prior to performing a memory operation.

13. The method of claim 11, wherein the functional compensation profile comprises:
   a fixed selected increment; and
   a distribution of the selected overdrive period across the multiple signal lines to compensate for variance in the electrical parameter across the multiple signal lines.

14. The method of claim 11, wherein the functional compensation profile comprises:
   a fixed selected overdrive period; and
   a distribution of the selected increment across the multiple signal lines to compensate for variance in the electrical parameter across the multiple signal lines.

15. The method of claim 11, wherein the functional compensation profile comprises multiple trim values distributed across the multiple signal lines using at least one of:
   a linear function;
   a piece-wise constant function;
   a piece-wise linear function; or
   a piece-wise polynomial function.

16. The method of claim 11, comprising:
   determining the functional compensation profile for the array of memory cells using a relationship between the selected increment and the selected overdrive period to reduce a settling time of the target voltage on the multiple signal lines.

17. The method of claim 12, comprising:
   determining the functional compensation profile for the array of memory cells using a relationship between the selected increment and the selected overdrive period and an electrical characteristic of the array of memory cells.

18. The method of claim 17, wherein the electrical characteristic of the array of memory cells comprises at least one of a resistance or a capacitance of at least one of the multiple signal lines.

19. The method of claim 17, wherein the electrical characteristic of the array of memory cells comprises a range of resistances across the multiple signal lines.

20. A system comprising:
   an array of memory cells including multiple signal lines, each signal line configured to provide access to a group of memory cells responsive to a bias condition of the respective signal line; and
   a compensation circuit configured to provide a respective bias signal to each of the multiple signal lines, each respective bias signal having an overdrive voltage greater than a target voltage by a selected increment and for a selected overdrive period according to a first one of the selected increment or the selected overdrive period fixed to a constant value and a distribution of a second one of the selected increment or the selected overdrive period across the multiple signal lines to compensate for variance in an electrical parameter across the multiple signal lines.

21. The system of claim 20, wherein the target voltage comprises a bias threshold voltage configured to be applied to a first signal line prior to performing a memory operation.

22. The system of claim 20, wherein the compensation circuit is configured to determine the functional compensation profile for the array of memory cells using a relationship between the selected increment and the selected overdrive period to reduce a settling time of the target voltage on the multiple signal lines.

23. The system of claim 20, wherein the compensation circuit is configured to determine the functional compensation profile for the array of memory cells using a relationship between the selected increment and the selected overdrive period and an electrical characteristic of the array of memory cells.

24. The system of claim 20, wherein the compensation circuit is configured to provide a respective bias signal to each of the multiple signal lines, each respective bias signal having an overdrive voltage greater than a target voltage by a selected increment and for a selected overdrive period according to a fixed selected increment and a distribution of the selected overdrive period across the multiple signal lines to compensate for variance in the electrical parameter across the multiple signal lines.

25. The system of claim 20, wherein the compensation circuit is configured to provide a respective bias signal to each of the multiple signal lines, each respective bias signal having an overdrive voltage greater than a target voltage by a selected increment and for a selected overdrive period according to a fixed selected overdrive period and a distribution of the selected increment across the multiple signal lines to compensate for variance in the electrical parameter across the multiple signal lines.

\* \* \* \* \*